United States Patent
Kawa et al.

(10) Patent No.: US 9,742,406 B2
(45) Date of Patent: Aug. 22, 2017

(54) CIRCUIT SKEW COMPENSATION TRIGGER SYSTEM

(71) Applicant: Synopsys, Inc., Mountain View, CA (US)

(72) Inventors: Jamil Kawa, Campbell, CA (US); Thu Nguyen, Palo Alto, CA (US); Raymond Tak-Hoi Leung, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/737,288

(22) Filed: Jun. 11, 2015

(65) Prior Publication Data

US 2015/0365075 A1 Dec. 17, 2015

Related U.S. Application Data

(60) Provisional application No. 62/011,556, filed on Jun. 12, 2014.

(51) Int. Cl.
*H03K 3/356* (2006.01)
*H03K 19/003* (2006.01)

(52) U.S. Cl.
CPC .............................. *H03K 19/00384* (2013.01)

(58) Field of Classification Search
CPC ........................ H03K 3/011; H03K 3/356113
USPC ........ 327/210, 170, 172–176, 211, 378–382, 327/509, 512, 513, 427, 434, 437, 327/108–112, 205, 206, 80, 81, 77, 142, 327/143; 326/82, 83, 87, 17, 120, 33; 365/226
See application file for complete search history.

(56) References Cited

U.S. PATENT DOCUMENTS

| | | | | |
|---|---|---|---|---|
| 4,521,698 A | * | 6/1985 | Taylor | H03K 19/00315 326/120 |
| 5,949,270 A | * | 9/1999 | Saito | H03K 17/145 326/31 |
| 6,154,045 A | * | 11/2000 | Ye | H03K 5/04 326/17 |
| 2003/0080802 A1 | | 5/2003 | Ono et al. | |
| 2005/0206430 A1 | * | 9/2005 | Choi | G01R 31/2621 327/333 |

(Continued)

FOREIGN PATENT DOCUMENTS

| | | |
|---|---|---|
| KR | 100231430 B1 | 11/1999 |
| KR | 100336563 B1 | 5/2002 |
| KR | 100762899 B1 * | 10/2007 |

OTHER PUBLICATIONS

PCT/US2015/035687, International Search Report, Date of mailing: Sep. 18, 2015, 3 pages.

(Continued)

*Primary Examiner* — Thomas Skibinski
(74) *Attorney, Agent, or Firm* — HIPLegal LLP; Judith Szepesi (57) ABSTRACT

A circuit skew compensation trigger system comprises a voltage divider including a P-transistor and an N-transistor and a center node in the voltage divider pulled to a first level. The circuit skew compensation trigger system further comprising a trigger to activate when a skew between the P-transistor and the N-transistor is above a threshold. The trigger to initiate a compensator to adjust for the skew.

20 Claims, 10 Drawing Sheets

(56) References Cited

U.S. PATENT DOCUMENTS

2006/0284658 A1* 12/2006 Wright ................. H03K 17/163
                                                    327/170
2008/0116455 A1   5/2008 Jain et al.
2008/0198677 A1*  8/2008 Son ........................ G11C 5/145
                                                    365/226
2015/0369855 A1* 12/2015 Kawa .................. G06F 17/5081
                                                    324/762.09

OTHER PUBLICATIONS

PCT/US2015/035687, Written Opinion of the International Searching Authority, Date of mailing: Sep. 18, 2015, 8 pages.

* cited by examiner

CIRCUIT SKEW COMPENSATION TRIGGER SYSTEM

RELATED CASES

The present invention claims priority to U.S. Provisional Application No. 62/011,556, filed on Jun. 12, 2014, which is incorporated herein by reference in its entirety.

FIELD

The present invention relates generally to the detection of drifts in the absolute or relative strength of P and N devices constituting a part or a whole of an electronic circuit and the trigger of a corresponding signal or set of signals.

BACKGROUND

In CMOS circuits the absolute strength of a P-device or an N-device or the relative strength of a P-device to an N-device determines several characteristics of the circuit such as timing, drive strength, and rise/fall times. The absolute or relative strength of a P-device or of an N-device can drift due to the standard spread in manufacturing process tolerances or with time due to phenomena such as Negative Bias Thermal Instability (NBTI), Positive Bias Thermal Instability (PBTI), or Hot Carrier Injection (HCI).

In the prior art, the solution has been to provide a circuit that can handle such drift, by providing longer timing intervals, larger base drive strength, and longer times for capturing data dependent on rise/fall times. However, this type of overhead is costly.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

The present invention addresses the issue of drift between P-devices and N-devices, by setting a trigger when the difference between the two device types is above a threshold. The trigger can be used to initiate or switch in a compensator to compensate for the drift.

In order to maintain the behavior of a target functional block over time within pre-determined specifications, sensor circuits are included in the block that monitor and sense in real time the drift between P-devices and N-devices in the block and generate a trigger signal, when the difference is above a threshold. The trigger signal may couple in a compensator, such as a corrective circuit when the monitored nodes deviate from a pre-set acceptable range. The trigger signal may change the timing of the circuit, or otherwise compensate for the drift.

In one embodiment, the system includes a circuit that monitors in real time the relative strength of a critical P-device using a voltage divider technique that depends on the strength of the P-device, triggering and latching a corrective signal when the relative strength of the P-device falls below a preset level. In one embodiment, the purpose of the circuit skew compensation trigger system is to detect the degradation of P-type circuit elements, by using the P-transistor in the voltage divider as a proxy for other P-transistors. The same concept can be applied for cases where the threshold of the sensor is higher due to a deteriorating N-device caused by Hot Carrier Injection (HCI), or another reason. The circuit thus enables compensation for skew, whether it is the result of manufacturing issues, degradation over time, another cause of failure.

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components.

Figure 1A:
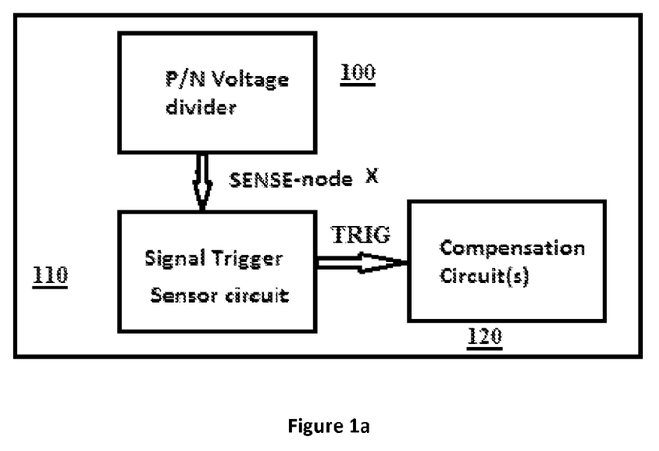
FIG. 1a is a block diagram of one embodiment of a basic P/N voltage divider sensor.

FIG. 1a is a block diagram of one embodiment of the circuit skew compensation trigger system. It is designed to sense in real time the relative strength of a P-device with respect to an N-device through a voltage divider circuit 100 and to switch a sensing circuit 110 once the output of the voltage divider X crosses a target threshold. The output of the sensor circuit 110 TRIG activates one or more compensation circuits 120.

Figure 1B:
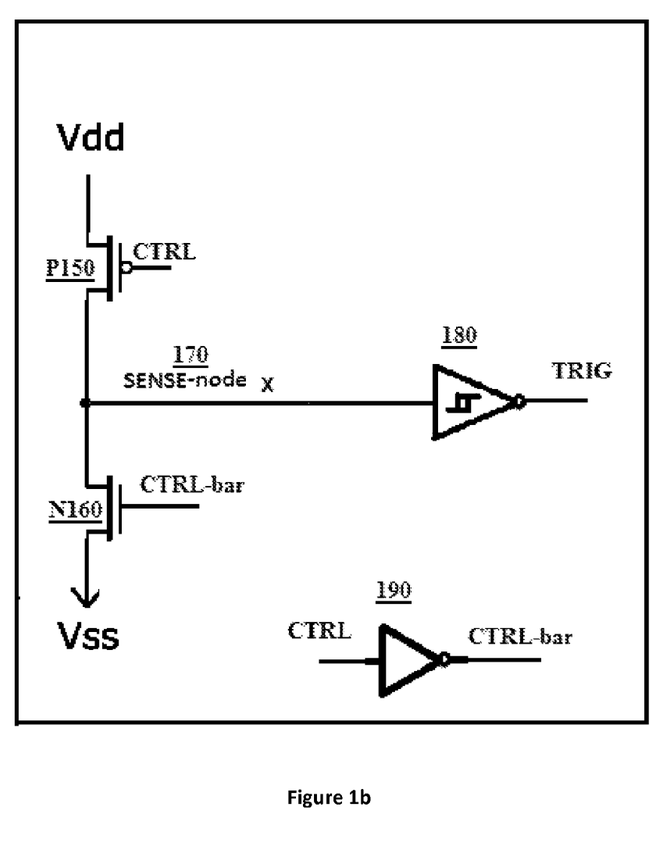
FIG. 1b is a circuit diagram of one embodiment of the P/N voltage sensor and the level-triggered circuit.

FIG. 1b is one embodiment of a circuit diagram of the circuit skew compensation trigger system. FIG. 1b corresponds to blocks 100 and 110 of FIG. 1a. The P-device P150 and the N-device N160 are sized to output, when "on," the initial voltage divider level X. This defines the starting SENSE-node X 170 reference voltage.

Since the performance of P-device P150 can be time and activity dependent, the system is designed to monitor and trigger when the performance is below a threshold. For example, the NBTI effect degrades the quality of the P-device P150. The P-device P150 is gated with the signal CTRL while the N-device N160 is gated with a complementary signal CTRL-bar to ensure pairwise switching of the P150 and N160 pair of the voltage divider. In one embodiment, CTRL-bar is generated by inverter 190.

As the strength of the P-device P150 weakens with time, the Sense-node X 170 voltage level drifts lower until it triggers the signal trigger. In one embodiment, the signal trigger is a Schmitt trigger 180 designed to be triggered at a pre-determined level of signal SENSE-node X. Although the circuit shows a Schmitt trigger 180, one of skill in the art would understand that alternative triggers, such as an inverter, sense amplifier, etc. may be used. The trigger 180 activates a compensation mechanism, not shown. The compensation circuit provides compensation for the degradation of the P-device P150, as described. As noted above, the compensation circuit may also compensate for the degradation of the N-device N160. The P-device P150, and N-device N160 are stand-ins for the other P-type and N-type devices in the CMOS circuit. The degradation of the P-device P150, or N-type device N160 therefore, is taken as an indicator that the other P-devices in the system are similarly degraded.

Figure 2:
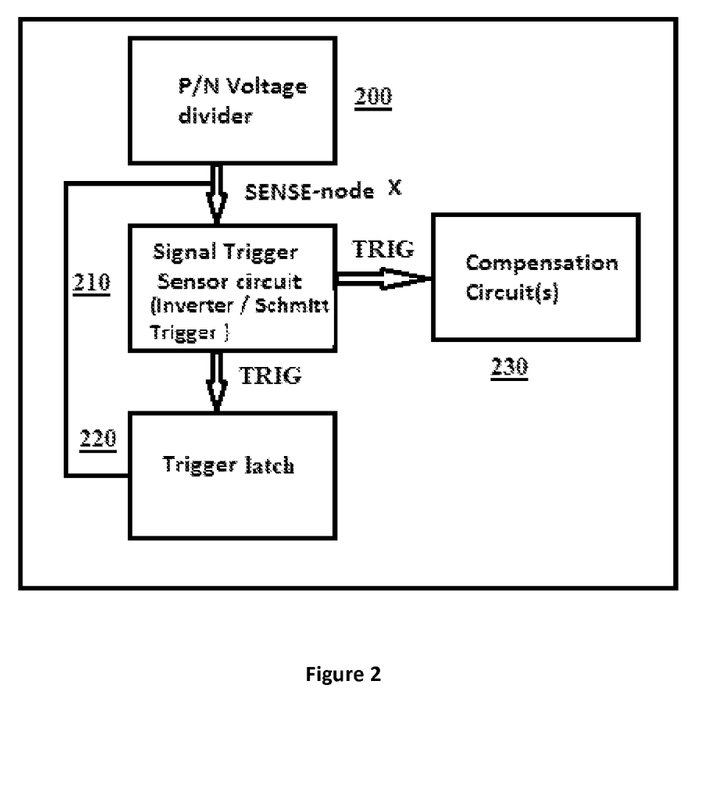
FIG. 2 is block diagram of one embodiment of the process of triggering a compensation circuit.

FIG. 2 is a block diagram of one embodiment of circuit skew compensation trigger system. The output at sense node X of P/N voltage divider 200 is sensed by signal trigger sensor circuit 210. The sensor circuit 210 is triggered when the voltage at SENSE-node X falls below a threshold. When that occurs, the output of signal trigger sensor circuit 210 changes. In one embodiment, trigger latch 220 latches the output, once the sensor circuit 210 is triggered, so the value output by sensor circuit 210 does not change once triggered. The output of sensor circuit 210 is output to compensation circuit 230. In one embodiment, instead of a single trigger that is latched, the system may include multiple triggers, each of which can be latched, as the threshold associated with the trigger is met.

Compensation circuit 230 is used to compensate for the degradation of the P-device. For example, a parallel P-device may be switched into the circuit, or voltage basis levels may be increased, or hold times may be lengthened, so that data is latched in time. The system may also switch in a read assist or write assist circuit, or other circuit elements to compensate for the degradation of the P-devices in the circuit.

Figure 3:
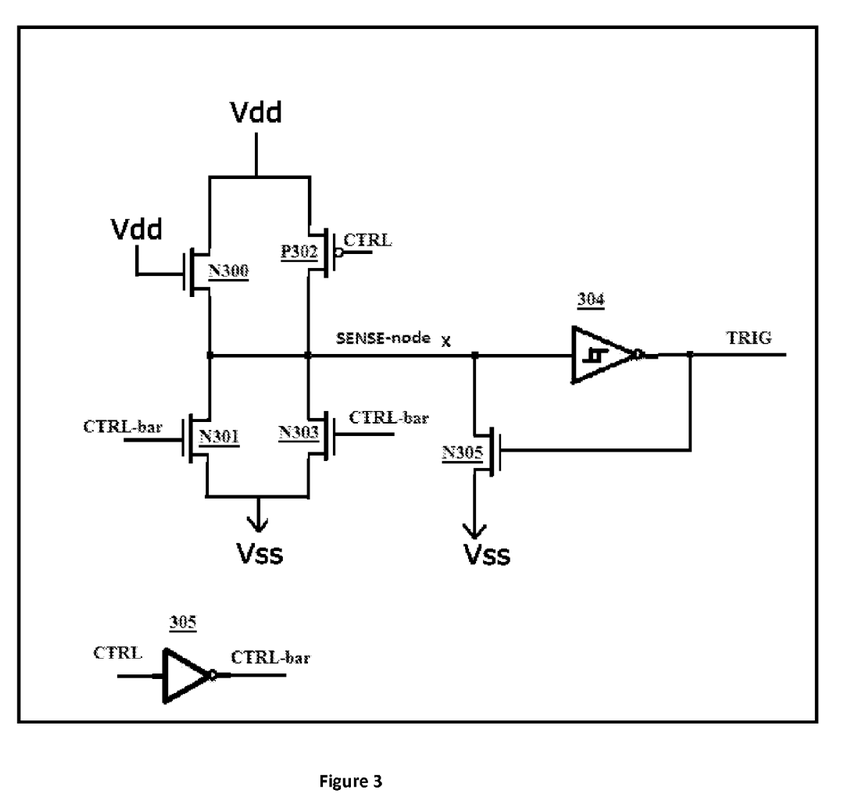
FIG. 3 is one embodiment of a circuit implementation of the trigger circuit.

FIG. 3 is a circuit diagram of one embodiment of the circuit skew compensation trigger system, for P-type devices. The basic building block of the voltage divider are transistors N300, N301, P302 and N303. Transistor pairs of N-type devices N300 and N301 are intended to establish the "constant in time" component of the voltage divider while the paired P-type device P302 and N-type device N303, are designed to have the same voltage divider ratio by strength as N300 to N301 at time "zero." However, the output of the pair P302 and N303 is time dependent, since the P-type devices degrade. P302 and N303 and are gated by the control signal CTRL and its compliment CTRL-bar. In one embodiment, N301 is also gated by CTRL-bar, while N300 is gated by Vdd.

The voltage divider output SENSE-node X is pulled to a "High" of "Vdd-Vtn" when CTRL is not asserted and CTRL-bar is asserted, and is at a level X when CTRL is asserted and CTRL-bar is not asserted. The level X is based on the relative strength of P302 and N303. In one embodiment, when P302 and N303 are balanced, for example at a Vdd of 0.9V, Vdd-Vtn is 0.65V while level X is 0.45V. In one embodiment, in this exemplary scenario, the trigger 304 may be triggered at 0.3V. In this context, Vdd is supply voltage, and Vtn is the threshold voltage of an N-device. Of course, these voltage levels are merely exemplary, and the actual level X and trigger level may be different, based on the needs of the circuit being monitored.

That voltage at node X is the input to a signal trigger sensor circuit represented here by the Schmitt trigger 304. The voltage at SENSE-node X drifts lower over time as P302 weakens until it is low enough to trigger the sensor circuit 304. Once Schmitt trigger 304 is triggered, in one embodiment, the output signal TRIG is asserted "High" allowing the latch N305 to pull node SENSE-node X low, locking TRIG in "High", i.e. enabled, state. TRIG is the activation signal for a compensation block to the particular function being compensated. In one embodiment, the signal CTRL-bar is generated by a simple inverter 305 from signal CTRL. Though FIG. 3 illustrates this evaluation for a P-type device, one of skill in the art would understand that the parallel test may be used to evaluate the effects of use on an N-type device as well.

Figure 4A:
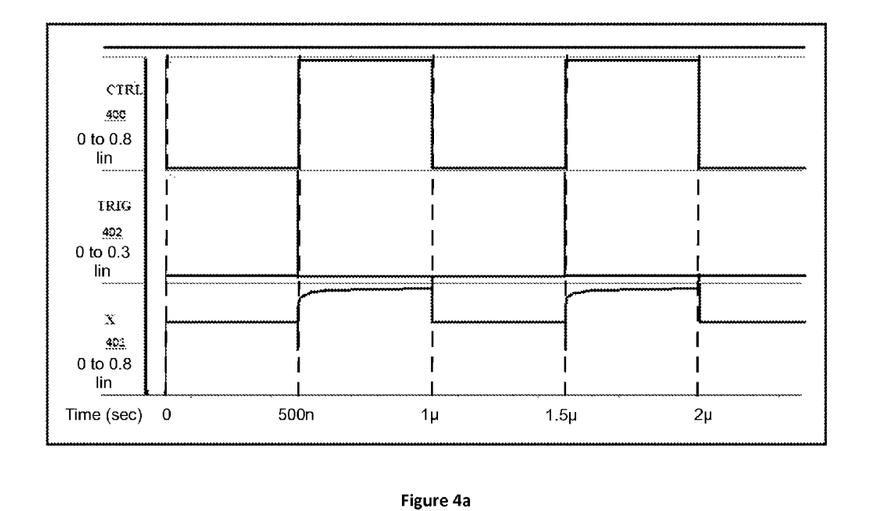
FIG. 4a illustrates a simulation output of the circuit of FIG. 3, for the case where the sensed voltage divider output X stays above the level needed to set the trigger.
Figure 4B:
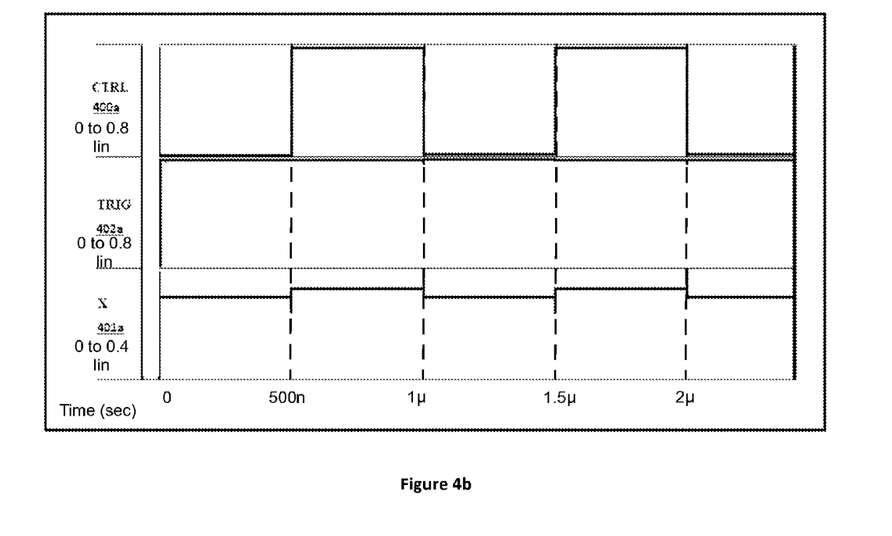
FIG. 4b illustrates a simulation output of the circuit of FIG. 3, for the case where the sensed voltage divider output X drops to the level needed to switch the trigger.

Referring to FIGS. 4a and 4b, FIG. 4a is a representative simulation output of the circuit of FIG. 3, for the case where the sensed voltage divider output X stays above the level needed to switch the trigger activation Schmitt trigger. In this simulation the Schmitt trigger is replaced by a simple inverter to capture a worst case TRIG output instability as the sensor circuit (inverter or Schmitt trigger) is undergoing an input level X close to the trigger voltage. Control signal 400 shows the normal switching of CTRL signal. Signal X 401 shows the voltage at SENSE-node X transitioning between a high of "Vdd-Vtn" and a low not low enough to switch the sense circuit. Trigger signal 402 shows the output of the sensor stuck at zero with sharp but "low" glitches (about 200 mV here) in the case of an inverter sensor with no hysteresis zone characteristic of a Schmitt trigger.

FIG. 4b is a representative simulation output of the circuit of FIG. 3 for the case where the sensed voltage divider output X drops sufficiently to trigger the Schmitt trigger. It also shows the signal TRIGGER 402a latched into a permanent "High" state. Control signal 400a shows the normal switching of CTRL signal. Voltage at SENSE-node X 401a show the node X transitioning between a high of "Vdd-Vtn" and a low that dips low enough to switch the sense circuit. Trigger 402a shows the output of the sensor circuit. Once TRIG switches "High" for the first time it activates the latch N305 of FIG. 3 locking the signal TRIG High regardless of control signal CTRL transitions.

Figure 5:
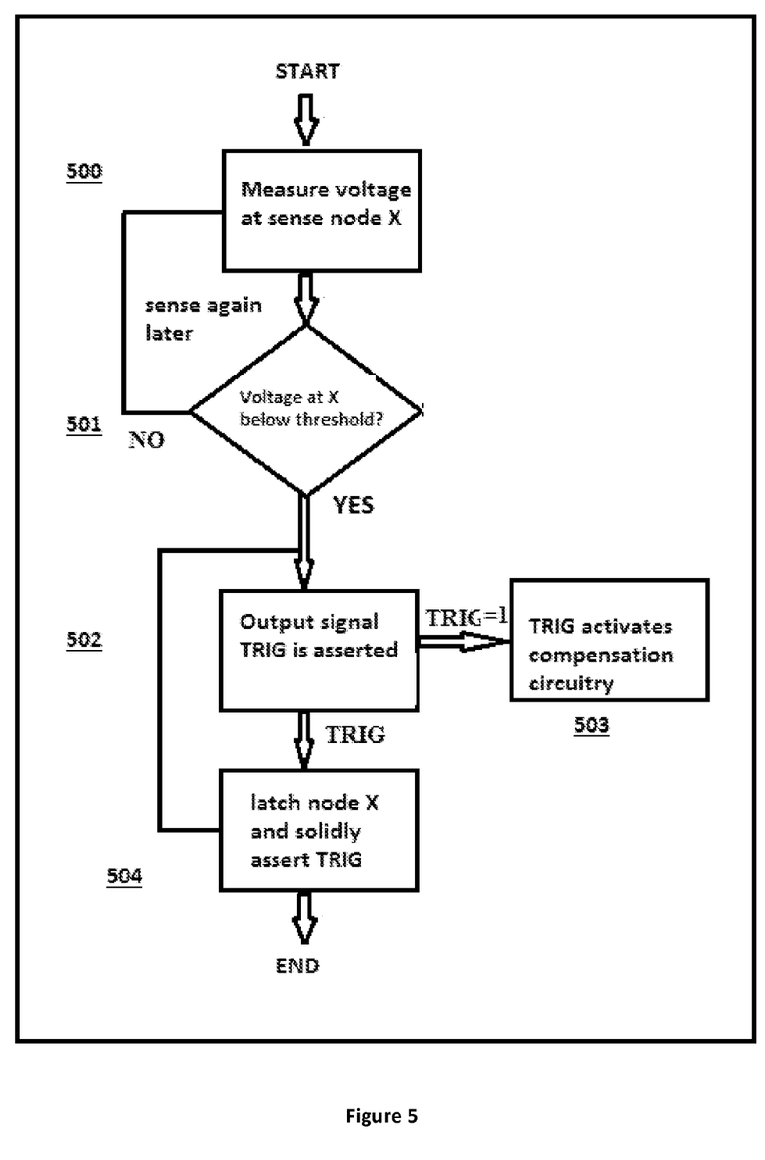
FIG. 5 is a flowchart of one embodiment of the process of triggering a compensation circuit.

FIG. 5 is a flowchart of one embodiment of the compensation trigger system. The process of Block 500 and Block 501 shows the time dependent loop of the sensor circuit (Schmitt trigger or inverter) sensing the output of the voltage divider circuit at SENSE-node X. As long as the voltage at sense node X remains above a threshold, as determined at Block 501, the system continues to measure the voltage at sense node X, and the trigger remains inactive, and returns to block 500 to measure again. In one embodiment, this measurement is continuous. In another embodiment, the measurement may be periodic.

When the voltage at SENSE-node X drops below the threshold, as measured at Block 501, the sensor circuit switches ON, asserting signal TRIG, at Block 502. The sensor circuit triggering activates the latch at Block 504. In one embodiment, the latch locks the sensor input "LO" and the TRIG output "HI". The assertion of output signal TRIG activates one or more compensation circuits at Block 503. In this way, the system can use the trigger to compensate for the change in the quality of the P-transitor, and/or N-transistor. In one embodiment, for a multi-level trigger, the process may return to block 500 to continue measuring the voltage at sense node X, prior to switching in a second or subsequent compensation circuit. A multi-level trigger provides multiple thresholds for triggering various compensation circuits. After a compensation circuit is latched into the system, the system continues to test the voltage at the sense node X, and may switch in additional compensation circuit elements, as warranted.

Figure 6:
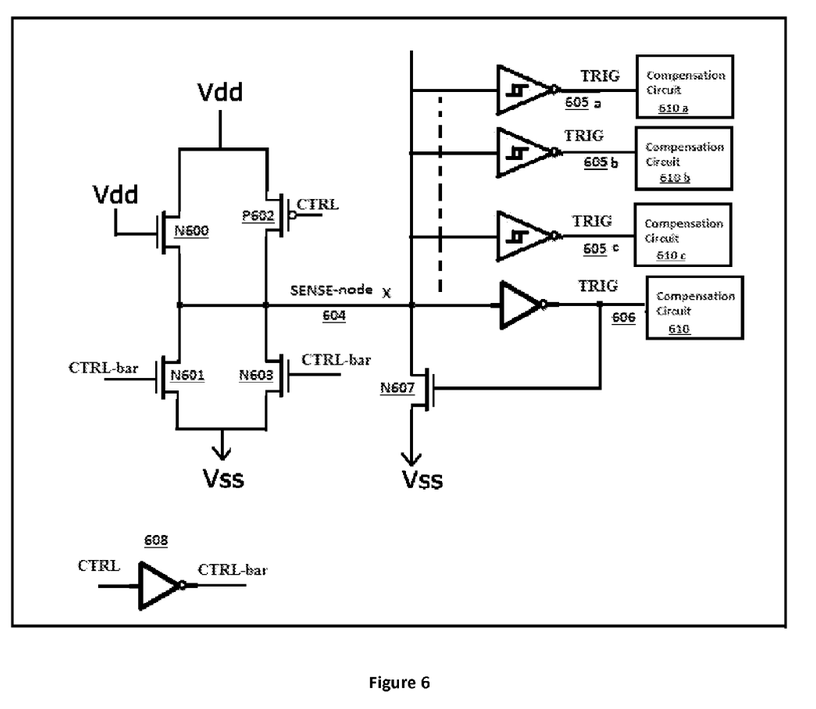
FIG. 6 is a circuit diagram of one embodiment of the sensor including multiple sensors.

FIG. 6 is a circuit diagram of one embodiment of a more comprehensive circuit representation where multiple sensors are activated at various levels. This enables the system to activate several compensation circuits at each activated in response to a different degree of P-device or N-device changes.

The operation of the time dependent voltage divider circuit N600, N601, P602, and N603 is the same as described in FIG. 3. However, instead of one sensor circuit reacting to a single pre-assigned level of SENSE-node X one or more of a bank of sensor circuits 605, 605a, 605b, 605c, etc. is activated.

Each trigger is activated at a pre-planned level of SENSE-node X. In one embodiment, the triggers have an increasingly lower voltage threshold, such that each trigger has a different threshold, and thus each trigger is triggered at a different voltage level. In one embodiment, each trigger activates a separate compensation circuit 610, 610a, 610b, 610c. Thus, when the first trigger level is reached, trigger 605a is activated, and the first compensation circuit 610a is activated. When the circuit subsequently degrades to such a level that the second trigger 605b is triggered, which is at a lower threshold voltage than the first trigger, the second compensation circuit 610b is activated. Having such a sequence of triggers and compensation circuits ensures that subsequent degradation of the circuit elements can be compensated for. In another embodiment, each trigger may be coupled to the same compensation circuit, and adjust a setting within the same compensation circuit. Alternative one or more compensation circuits may be used, as needed. The compensation circuits may all be of the same type, or may be different types, at different levels. In one embodiment, a single trigger may activate more than one compensation circuit.

In one embodiment, latch N607 is activated by last trigger signal TRIG 606 representing the sensor with the lowest activation threshold. In this way, as the P-transistor continues to degrade, additional compensation circuits may be switched into the circuit. This enables extending the functional life of a circuit, and reduces the chances of a fatal circuit issue. In one embodiment, the system may substitute N-transistor testing, instead of P-transistor, as would be understood by one of skill in the art. In such an example, each N-type transistor in the circuit would be replaced by a P-type transistor, and vice versa. Furthermore, Vdd would be replaced by Ground, while Control and Control-Bar would remain the same. One of skill in the art would understand how to modify this circuit to appropriately test N-transistor degradation. In one embodiment, a full circuit implementation may include testing for both types of transistors.

In one embodiment, a circuit may have multiple sensors and compensation circuits. In one embodiment, the system may have separate sensors for fast P-transistors, slow P-transistors, transistors in different locations on the circuit, transistors having different voltage level inputs, etc. The compensation circuitry in on embodiment may be location dependent.

Figure 7:
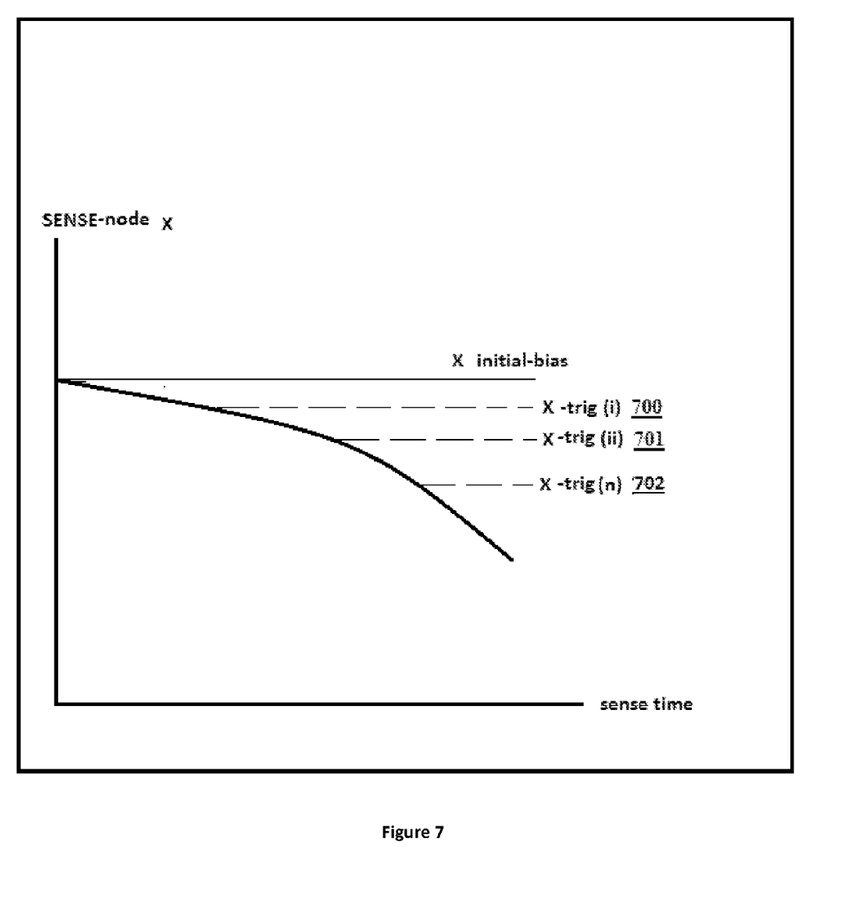
FIG. 7 is timing diagram for the voltage divider output node X indicating the DC level and the time-dependent trigger levels

FIG. 7 is an exemplary plot of the voltage divider output node X as a function of time indicating the DC level at time t=0 and the time-dependent trigger levels 700, 701, 702. etc., activating the switching of corresponding sensor circuits. Note that the compensation circuits may address the behavior at the actual transistors, but do not impact the behavior of the sensor circuitry described, since no compensation is applied to this circuitry.

Figure 8:
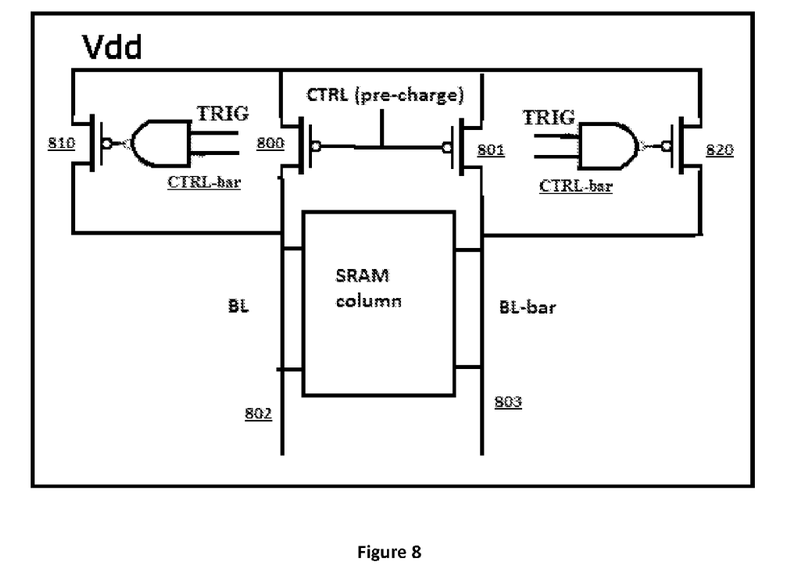
FIG. 8 is a circuit diagram of one embodiment of an SRAM pre-charge and compensation circuit

FIG. 8 is one embodiment of a compensation circuit for an SRAM pre-charge circuit. P-devices 800 and 801 are the initial devices sized to meet specific timing constraints for setting the value of BL 802 and BL-bar 803. P-devices 810 and 820 are compensation devices triggered by the TRIG signal of a sensor circuit. When the previously unused P-devices 810 and 820 are switched into the circuit, the circuit returns to the pre-deterioration state. This brings the pre-charge strength and timing to pre-deterioration state. Although only one set of substitute transistors are shown, a system may include multiple levels of substitute transistors, which may be switched into the circuit as needed.

Figure 9A:
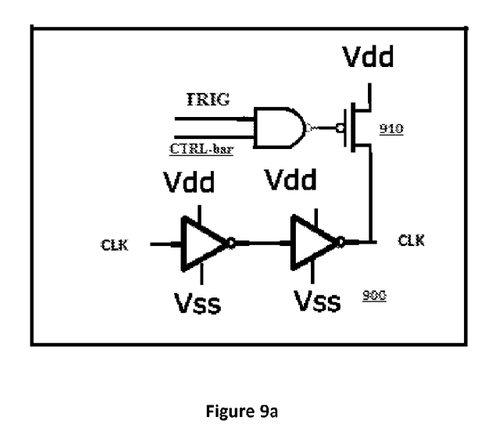
FIG. 9a is a circuit diagram of one embodiment of a clock net driver with a P-Device rise-time booster compensation circuit.
Figure 9B:
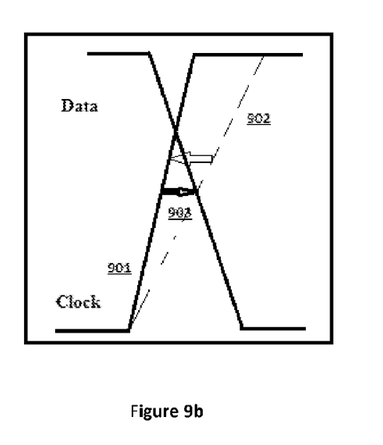
FIG. 9b is a timing diagram of a clock and data hold time as a function of clock rise time, showing deterioration and the effect of compensation.

FIG. 9a is a circuit diagram of one embodiment of the compensation circuit for data hold compensation of a deteriorating rise time of a clock driver. The compensation circuit includes a compensation P-device 910, switched into the circuit, when the prior P-type device deteriorates sufficiently to cause the clock to skew. FIG. 9b illustrates an exemplary clock signal and data signal. The clock signal 901 represents the initial rise-time of the clock driver. The dashed line of clock signal 902 represents a deteriorated rise time of the clock driver, due to deterioration of a P-type device, in one embodiment. The gap 903 represents the initial data hold time. As can be seen, with deterioration, there is insufficient hold time. By switching in compensation circuit, N-type transistor 910, the clock is restored (shown by the white arrow). By using such a compensation circuit the circuit can be designed so that the clock frequency need not account for the expected deterioration of the rise time of the clock driver.

Figure 10A:
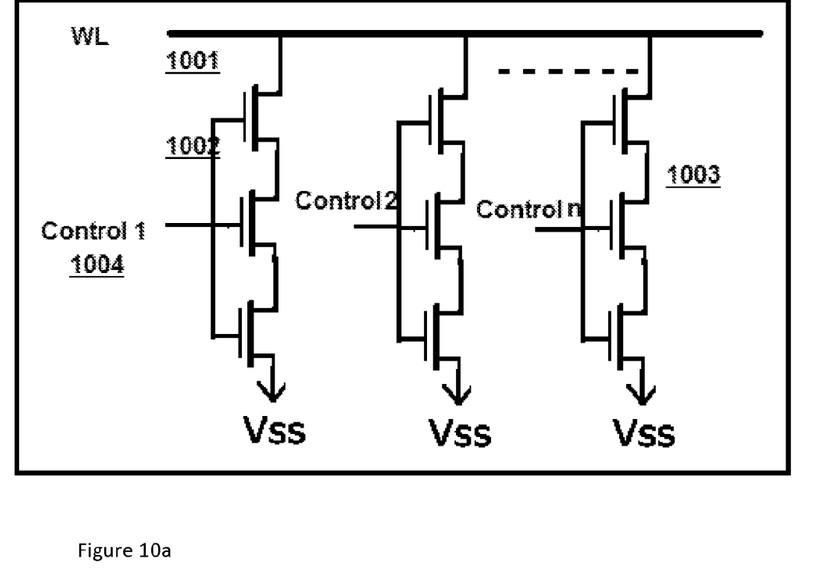
FIG. 10a is a circuit diagram of one embodiment of a read assist circuit.
Figure 10B:
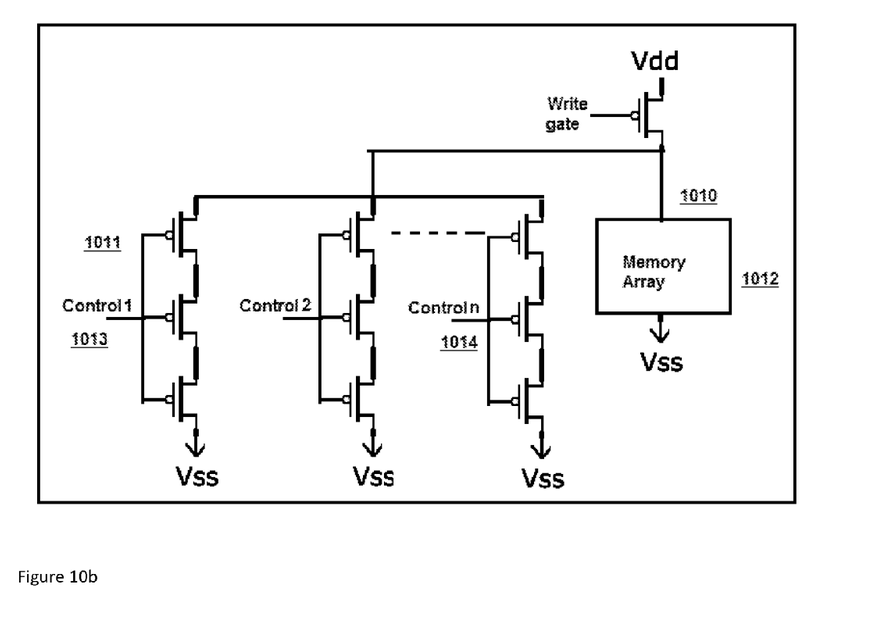
FIG. 10b is a circuit diagram of one embodiment of a write assist circuit.

FIG. 10a is circuit diagram for one embodiment of a read assist circuit. A read assist circuit can be implemented, in one embodiment, weakening the voltage level of the wordline thus weakening the drive of the access N device during the read operation. The weakening may be a few millivolts. Based on the sensor's block outputs, one to "n" control signals 1004 can be generated to fine-tune the strength of the "bleeder" N-devices. By switching one or more of the bleeder N-devices into the circuit, the voltage level of the wordline will be tuned as desired FIG. 10b is a circuit diagram for one embodiment of a write assist circuit. One way of implementing a write assist is to "collapse" VDD going to the memory array during write by creating a voltage-divider network with a plurality of P-type devices. The voltage divider network, as shown, may include one or more dividers which may be independently activated through control 1 through control n. The system generates control signals based on the difference in strength detected by the sensor circuit, as discussed above. By switching in one or more of the dividers in the network, the appropriate level of voltage collapse is achieved.

Of course, the exemplary circuits provided for read and write assist are merely examples. Any method of adjusting for the skew detected by the trigger circuit may be utilized, whether currently known or later developed, without departing from the present invention.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A circuit skew compensation trigger system comprising:
   a voltage divider including a P-transistor and an N-transistor;
   a center node in the voltage divider pulled to a first level;
   a trigger to activate when a skew between the P-transistor and the N-transistor is above a threshold, and the trigger to initiate a compensator to adjust for the skew, thereby enabling correction for degradation of one or more of the P-type transistor and the N-type transistor; and
   wherein the compensator comprises a read assist circuit in an SRAM, where the P-transistor in the voltage divider models a need for the read assist circuit, and the trigger switches in the read assist circuit.

2. The circuit skew compensation trigger system of claim 1, wherein the P-transistor and the N-transistor are sized to achieve an initial voltage reference value.

3. The circuit skew compensation trigger system of claim 1, further comprising:
   a second voltage divider comprising two N-transistors, a first N-transistor having as an input Vdd, and the second N-transistor having as an input inverted control signal (CTRL), an output of the second voltage divider providing the first level voltage at the center node in the voltage divider.

4. The circuit skew compensation trigger system of claim 1, further comprising:
   a latch to keep the trigger on, once the trigger is activated, thereby keeping the compensator active.

5. The circuit skew compensation trigger system of claim 1, wherein the compensator comprises an additional pre-charge device in an SRAM, where the P-transistor in the voltage divider models a condition of a first pre-charge device in the SRAM.

6. The circuit skew compensation trigger system of claim 1, wherein the compensator comprises a hold time adjustor in a flip flop, wherein the P-transistor in the voltage divider represents a P-device in a clock driver reflected in a clock rise time degradation.

7. The circuit skew compensation trigger system of claim 1, wherein the skew results from one or more of: circuit aging or negative bias temperature instability, process skew or random process variation.

8. The circuit skew compensation trigger system of claim 1, wherein the skew results from Hot Carrier Injection (HCI).

9. A method of providing a circuit compensation trigger system comprising:
   monitoring a voltage at a sense node, the sense node the output of a voltage divider including a P-transistor and an N-transistor, the voltage at the sense node representing a skew between the P-transistor and the N-transistor;
   setting a first level voltage at the sense node using a second voltage divider, the second voltage divider comprising one of:
      two N-transistors, a first N-transistor having as an input Vdd, and a second N-transistor having as an input an inverted control signal (bar CTRL); and
      two P-transistors, a first P-transistor having as an input Ground, and a second P-transistor having as the input the bar CTRL;
   activating a trigger when the voltage at the sense node is below a threshold, the trigger to initiate a compensator to adjust for the skew.

10. The method of claim 9, wherein the P-transistor and the N-transistor are sized to achieve an initial voltage reference value.

11. The method of claim 9, further comprising:
    latching the trigger, after the trigger is activated, to keep the trigger on, thereby keeping the compensator active.

12. The method of claim 9, wherein the compensator comprises one of:
    an additional pre-charge device in an SRAM, where the P-transistor in the voltage divider models a condition of a first pre-charge device in the SRAM,
    a read assist circuit in an SRAM, where the P-transistor in the voltage divider models a need for the read assist circuit, and the trigger switches in the read assist circuit,
    a write assist circuit in the SRAM, where the P-transistor in the voltage divider models the need for the write assist circuit, and the trigger switches in the write assist circuit, and
    a hold time adjustor in a flip flop, wherein the P-transistor in the voltage divider represents a P-device in a clock driver reflected in a clock rise time degradation.

13. The method of claim 9, wherein the skew results from one or more of: circuit aging or negative bias temperature instability, process skew or random process variation.

14. The method of claim 9, wherein the skew results from Hot Carrier Injection (HCI).

15. A circuit comprising:
    a first pair of a first type of transistors in a voltage divider arrangement;
    a second pair of transistors in a second voltage divider arrangement, the second pair of transistors including one first type transistor and one second type transistor, the second pair of transistors sized to match the first pair of transistors;
    a sense node, coupled to the voltage divider and the second voltage divider, a value of the sense node based on a relative strength of the one second type transistor and the one first type transistor; and
    a trigger circuit that activates when the signal drops below a threshold, to output a trigger signal to activate a compensator.

16. The circuit of claim 15, wherein the configuration is one or more of:
    the first type of transistor comprises an N-type transistor, and the second type of transistor comprises a P-type transistor, the compensator to compensate for degradation of the P-type transistor due to one or more of circuit aging, negative bias temperature instability, process skew, and random process variation; and
    the first type of transistor comprises a P-type transistor, and the second type of transistor comprises an N-type transistor, the compensator to compensate for degradation of the N-type transistor due to one or more of circuit aging, hot carrier injection, process skew, and random process variation.

17. The circuit of claim 15, further comprising:
    a second trigger circuit coupled to the sense node, the second trigger circuit having a second threshold lower than the first threshold, the second trigger circuit to activate a second compensator when the voltage at the sense node decreases to the second threshold.

18. The circuit of claim 15, wherein the compensator comprises a read assist circuit in an SRAM, where the P-transistor in the voltage divider models a need for the read assist circuit, and the trigger switches in the read assist circuit.

19. The circuit of claim 15, wherein the P-transistor and the N-transistor are sized to achieve an initial voltage reference value.

20. The circuit of claim 15, further comprising:
   a latch to keep the trigger on, once the trigger is activated, thereby keeping the compensator active.

* * * * *

UNITED STATES PATENT AND TRADEMARK OFFICE
CERTIFICATE OF CORRECTION

PATENT NO. : 9,742,406 B2
APPLICATION NO. : 14/737288
DATED : August 22, 2017
INVENTOR(S) : Jamil Kawa et al.

Page 1 of 1

It is certified that error appears in the above-identified patent and that said Letters Patent is hereby corrected as shown below:

In the Claims

Column 7, Line 54, replace "the sense node the" with --the sense node being at the--.

Signed and Sealed this
Fifth Day of December, 2017

Joseph Matal
*Performing the Functions and Duties of the
Under Secretary of Commerce for Intellectual Property and
Director of the United States Patent and Trademark Office*